SHIELDING HOUSING FOR MULTISTAGE TUNER WITH
INTERMEDIATE FREQUENCY OUTPUT CIRCUIT
Filed June 24, 1964

INVENTOR
HERBERT MEYER

BY Dicke + Craig
ATTORNEYS

United States Patent Office
3,387,214
Patented June 4, 1968

3,387,214
SHIELDING HOUSING FOR MULTISTAGE TUNER WITH INTERMEDIATE FREQUENCY OUTPUT CIRCUIT

Herbert Meyer, Rottweil (Neckar), Germany, assignor to R. & E. Hopt KG.

Filed June 24, 1964, Ser. No. 377,697
Claims priority, application Germany, July 13, 1963, H 45,514
7 Claims. (Cl. 325—357)

ABSTRACT OF THE DISCLOSURE

A shielding housing for a multistage tuner, especially applicable to television receivers, wherein on one wall of the tuner housing there is mounted a separate substantially similar box-like enclosure for an IF-output circuit, the separate enclosure being closed by a cover plate formed as a printed circuit board having a shielding layer thereon in addition to a printed circuit.

Figure 1:
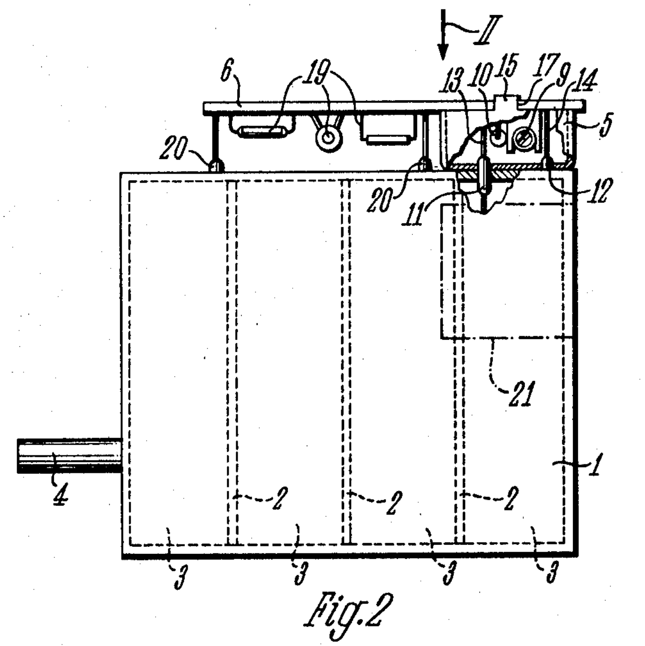

The invention relates to a tuner for the reception of high-frequency electrical oscillations (HF), with a mixing stage for producing an intermediate frequency and an output circuit for this intermediate frequency (IF), more especially to VHF- or UHF-tuners for television sets, the circuit elements of which are substantially accommodated in a shielding-casing.

Shielding casings for such HF-tuners usually have five chambers, of which one is to accommodate the input circuit of a preamplifier, the second is to hold the output circuit of said preamplifier, the third is intended to contain the input circuit of a mixing stage while the fourth is destined to accommodate the oscillator circuit of this mixing stage. The fifth chamber holds the circuit elements of the IF output circuit. Such a fifth chamber is required in particular when the first four circuits mentioned are formed as cavity circuits, because in such cavities the lumped circuit elements of the IF-output circuit would have an extremely disturbing effect. However, the provision of a fifth chamber within the tuner casing to accommodate the IF-circuit constitutes a drawback for several reasons. Firstly, it increases the dimensions of the tuner casing to an unnecessarily high extent because, although the circuit elements to be accommodated therein require a certain width of this chamber, they occupy only a small portion of the length of the chamber. Consequently, the space not occupied by the circuit elements of the IF-circuit is wasted. Another disadvantage is that the operations required to produce the IF-circuit are difficult to execute in the narrow chamber of the tuner casing.

The invention is based on the task of avoiding these drawbacks inherent in the known tuners. The invention consists in providing a tuner construction wherein a separate box is attached to one wall of the tuner housing for shielding the circuit elements of the IF-circuit, and this box is closed by a cover plate which has been formed as a printed circuit, the lining of which has only such cutouts in the region of the surface limited by the side walls of said box which are necessary for the formation of the IF-output circuit and is in conductive contact with the walls of the box, and the circuit elements of the IF-output circuit are connected to the printed circuit and project into the box when the cover plate is in place. The separate box attached to the outside of the tuner casing can be made relatively small, in any case much smaller than a fifth chamber of the tuner casing, because only a few circuit elements have to be accommodated therein. The positioning of the circuit elements on the cover plate being formed as a printed circuit can be effected without difficulty prior to putting said cover plate in place on the box. The lining of the cover plate, which is in substantially conductive contact with the walls of the box, completes the shielding achieved by means of the box without additional expenditure, and without the necessity of a separate, high-frequency-sealed cover. The invention thus offers the advantages of an especially space-saving construction, of a simplification of the wiring operations of the IF-circuit, effected with a minimum of circuit and shielding means.

The lining will be preferably placed on the outside of the cover plate. To achieve a conductive contact between said lining and the walls of the box, there may be provided on at least one of the side walls of the box a lip extending beyond the cover plate and preferably engaging into a corresponding recess thereof, to which those portions of the lining which are to be grounded are connected, in particular by soldering. If, for example, such lips are provided on two opposite walls of the box, these will ensure not only an excellent electrical contact, but also confer an excellent mechanical stability to the cover plate, so that other attaching means can be dispensed with.

In an especially simple embodiment of the invention, the box is formed by a sheet metal frame attached to one wall of the tuner casing. The input leads for the IF-circuit accommodated in the box traverse the wall of the tuner housing within the box. They traverse the box and are connected with the lining of the cover plate, in particular by soldering. In another embodmient, the covering plate may be substantially greater than the ground surface of the box. The parts located beside the box can then form a printed circuit for further arrangements. Thus, there may be arranged for example the circuit elements for the voltage supply of the tubes or transistors present in the tuner.

Figure 2:
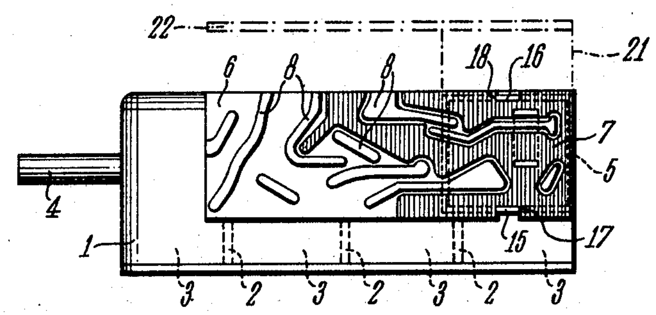

The invention will now be described in detail with reference to an exemplary embodiment illustrated in the drawing, wherein:

FIG. 1 shows a top view of a tuner with an IF-box according to the invention in partial section, and FIG. 2 is a view of the tuner according to FIG. 1, in direction of the arrow II.

The interior of the tuner casing 1 is subdivided by the separating walls 2 indicated by broken lines into several chambers 3. In a UHF-tuner for example, there may be arranged, from left to right, a broad-band UHF-input circuit for a pre-amplifier, followed by the tuned output circuit of this pre-amplifier which, together with the following tuned input circuit of a self-oscillating mixing stage, forms a band-pass filter and, finally, in the last chamber, the oscillating circuit of this mixing stage. These circuits can be tuned with the aid of a variable capacitor, the rotors of which are seated on a common shaft 4.

The combined frequencies produced in the mixing stage of the tuner must be fed to an IF-output circuit tuned to the intermediate frequency which is to be further treated in an intermediate frequency amplifier. This output circuit must also be shielded, in order to avoid a loss by radiation of the remaining combined frequencies, in particular of very high sum frequencies. To this effect, a separate screening box 5 is mounted on one of the narrow sides of the tuner casing, in which the circuit elements of the IF-output circuit are accommodated. The box 5, which may for example be soldered to the wall of the housing 1, is closed by means of a cover plate 6, which has been formed as a printed circuit element. The lining 7, 8 is arranged on the outside of the cover plate. The circuit elements of the IF-output circuit, of which a transformer coil 9 and a resistance 10 are shown in FIG.

1 by way of example, are connected to the cover plate, by soldering to the lining 7, 8 of the printed circuit. They are located on the internal side of the cover plate 6, so that they are located within the box 5 when the cover plate is set in place. The input leads for the IF-circuit located in the box, coming out of the tuner casing 1 through the lead-through capacitors 11 and 12, traverse the box and are likewise connected to the lining of the cover plate. When the plate 6 is set upon the box 5, these leads 13 and 14 are engaged in corresponding holes of the cover plate 6 and are then soldered to the lining 7, 8.

In order to achieve a good shielding, the lining of the plate 6 has only such cutouts in the region of the surface limited by the side walls of the box which are necessary for the formation of the IF-output circuit. There thus remains a large, continuous metallic surface 7, which effectively covers the upper opening of the box 5. Portion 7 of the lining is in conductive contact with the walls of the box 5. To this effect, two opposite walls of the box are provided with lips 15 and 16 which extend beyond the covering surface of the plate 6 and which engage into corresponding recesses 17 and 18 on the opposite longitudinal edges of the cover plate 6. The lips 15 and 16 are connected to portion 7 of the lining by solder. In co-operation with the corresponding recesses 17 and 18, the soldering connection of the cover plate ensures a sufficient mechanical retaining means, so that further attaching means can be dispensed with. The cover plate 6 shown in the drawing is substantially greater than the ground surface of the box 5. The parts of the cover plate extending beyond the box may form a printed circuit for further arrangements or circuit elements. It is possible for example to arrange on the overlapping portion circuit elements necessary for the voltage supply of the tubes, transistors, etc., contained in the tuner. FIG. 1 indicates such circuit elements 19 as well as leads 20 leading into the tuner housing and traversing lead-through capacitors.

The invention is not limited to the exemplary embodiment shown. Thus, for example, box 5 does not need to be provided with a separate bottom, but could be formed by a simple frame attached to one of the side walls of the tuner housing. Furthermore, this box need not be attached to a narrow side of the tuner housing, but could also be attached to its rear wall for example, as indicated in FIGS. 1 and 2 by the composite lines 21 and 22.

What I claim is:

1. In a multistage tuner assembly for receiving high frequency electrical signals, especially for television receivers, a shielding casing forming a housing for the circuit elements of the assembly comprising a first box-like housing member having a plurality of substantially equal size enclosed compartments for individual tuner stages, a second separate substantially smaller box-like housing member mounted on one wall of said first housing member and having at least one open end, a closure member in the form of a printed circuit board extending over at least said open end of said second housing member, at least the surface of said printed circuit board limited by the side walls of said second housing member being provided with a conductive shielding layer over the entire portion thereof with the exception of those areas provided with a printed circuit, said shielding layer being in conductive contact with said second housing member.

2. The combination defined in claim 1 wherein said printed circuit board is provided with circuit elements connected to the printed circuit thereon forming a stage of said tuner assembly extending from the printed circuit board into the second housing member.

3. The combination defined in claim 1, wherein said conductive shielding layer is disposed on the outwardly facing surface of said printed circuit board.

4. The combination defined in claim 3 wherein at least one side wall of said second housing member is provided with a projection extending over an edge of said closure member into contact with said conductive shielding layer.

5. The combination defined in claim 1 wherein said second housing member is constituted by a sheet metal frame and is substantially smaller than any of said enclosed compartments.

6. The combination defined in claim 1 further including connecting leads extending from one of said compartments through the walls of said first and second housing members to said printed circuit board for interconnecting a tuner stage housed in said first housing member with the tuner stage housed in said second housing member.

7. The combination defined in claim 1 wherein said printed circuit is substantially larger than said open end of said second housing member providing a portion overhanging said first housing member upon which a printed circuit is provided for connection to the tuner stages in said first housing member.

References Cited

UNITED STATES PATENTS

| | | | |
|---|---|---|---|
| 2,922,043 | 1/1960 | Decker et al. | 334—85 |
| 2,963,577 | 12/1960 | Errichiello et al. | 325—357 |
| 2,995,657 | 8/1961 | Rummer | 334—85 |
| 3,181,069 | 4/1965 | Eland | 325—357 |

KATHLEEN H. CLAFFY, *Primary Examiner.*

R. S. BELL, *Assistant Examiner.*